United States Patent [19]

Orimoto et al.

[11] Patent Number: 5,203,218
[45] Date of Patent: * Apr. 20, 1993

[54] SYSTEM FOR UNLOADING A MEMORY CARTRIDGE

[75] Inventors: Masaaki Orimoto; Toshikatsu Harase; Masahiko Mizuno, all of Tokyo, Japan

[73] Assignee: Fuji Photo Film Co., Ltd., Kanagawa, Japan

[*] Notice: The portion of the term of this patent subsequent to Jan. 19, 2010 has been disclaimed.

[21] Appl. No.: 872,176

[22] Filed: Apr. 22, 1992

Related U.S. Application Data

[63] Continuation of Ser. No. 715,891, Jun. 19, 1991, Pat. No. 5,179,871, which is a continuation of Ser. No. 314,744, Feb. 24, 1989, abandoned.

[30] Foreign Application Priority Data

Feb. 29, 1988 [JP] Japan .................................. 63-047052

[51] Int. Cl.⁵ .......................... G05G 1/04; G11B 5/008
[52] U.S. Cl. .......................... 74/516; 74/110; 360/96.3
[58] Field of Search ............. 74/516, 520, 110, 480 B, 74/480 R; 358/342, 906, 909; 365/229; 360/96.3; 312/303

[56] References Cited

U.S. PATENT DOCUMENTS

| | | | |
|---|---|---|---|
| 2,915,915 | 12/1959 | McKay | 74/480 B |
| 3,756,191 | 9/1973 | Olah | 74/110 |
| 3,759,529 | 9/1973 | Yoshii | 360/86.3 |
| 4,133,260 | 1/1979 | Gundal | 74/520 |
| 4,263,628 | 4/1981 | Timm | 360/96.3 |
| 4,400,985 | 8/1983 | Bond | 74/110 |
| 4,426,554 | 1/1984 | Jacobson | 360/96.3 |
| 4,530,252 | 7/1985 | Sarges et al. | 74/437 |
| 4,730,792 | 3/1988 | Jang | 360/96.3 |
| 4,824,087 | 4/1989 | Hannel | 74/110 |

FOREIGN PATENT DOCUMENTS

| | | | |
|---|---|---|---|
| 58304 | 1/1975 | Australia | 74/110 |
| 2912117 | 10/1979 | Fed. Rep. of Germany | 74/110 |
| 2919634 | 11/1979 | Fed. Rep. of Germany | 360/96.3 |
| 175239 | 9/1985 | Japan | 360/96.3 |
| 2181880 | 4/1987 | United Kingdom | 360/96.3 |

OTHER PUBLICATIONS

Nikkei Electronics Publication of Dec. 16, 1985.

*Primary Examiner*—Vinh T. Luong
*Attorney, Agent, or Firm*—Sughrue, Mion, Zinn, Macpeak & Seas

[57] ABSTRACT

A memory cartridge unloading system in which a memory cartridge inserted into a connector provided in a main body of an apparatus using a memory cartridge can be pulled out from the connector by use of a leverage mechanism. In the unloading system, the memory cartridge is moved in the discharge direction thereof by the leverage mechanism. In the leverage mechanism, the leverage thereof can be changed according to the positions of movement of the memory cartridge in the discharge direction, so that a first force can be generated until the memory cartridge is generated which can pull out the memory cartridge from the apparatus main body the second force being an amount necessary for a finger catch.

3 Claims, 6 Drawing Sheets

SYSTEM FOR UNLOADING A MEMORY CARTRIDGE

This is a continuation of application Ser. No. 715,891 filed Jun. 19, 1991, now U.S. Pat. No. 5,179,871, which is a continuation of application Ser. No. 314,744, filed on Feb. 24, 1989, now abandoned.

BACKGROUND OF THE INVENTION

1. Field of the Invention

The present invention relates to a system for unloading a memory cartridge and, in particular, to such system using a leverage mechanism.

2. Description of the Related Art

Recently, a memory cartridge has attracted considerable attention as an external memory means for use with an electronic apparatus or the like. The memory cartridge of this type includes an integrated circuit (IC) card and the like and the memory cartridge comprises a card-shaped box in which a semiconductor memory, i.e., Erasable Programmable Read Only Memory (EPROM), Static Random Access Memory (SRAM), or the like, a microcomputer, batteries to be used for backing-up, and the like are stored. Also, for access to the semiconductor memory and the like, there are arranged a large number of terminals which are to be connected with connectors provided on the side of the electronic apparatus. In general, the box has a thickness of several mm, but it may have a relatively greater thickness.

Such memory cartridge is manually inserted into or removed from the connector of the electronic apparatus and such insertion or removal requires a great force because the large number of terminals provide a large resistance force.

Therefore, according to the prior art system, in order to secure a catch by fingers for movably removing or unloading the memory cartridge, the memory cartridge must be projected from a main body of the electronic apparatus. However, such projection structure often causes the memory cartridge to be touched unexpectedly, and there is a possibility of the memory cartridge being damaged. On the other hand, if the system is constructed such that the whole memory cartridge is stored within the apparatus main body, then it is impossible to unload the memory cartridge therefrom. In view of the above-mentioned circumstances, conventionally, there has been proposed and practiced a memory cartridge unloading system which utilizes a lever for easy unloading of the memory cartridge.

However, in the memory cartridge unloading system using a leverage mechanism, the leverage of a lever which forms part of the leverage mechanism must be set large in order to generate a large force for taking out the memory cartridge from the connector of the electronic apparatus, and also the discharge stroke of the memory cartridge must be set large to be able to pick out the memory cartridge. This requires a large stroke of the lever, with the result that a space for installation must be large. This raises a problem especially when this type of memory cartridge unloading system is applied to a small-sized electronic apparatus and the like which uses a memory cartridge.

SUMMARY OF THE INVENTION

The present invention aims at eliminating the drawbacks found in the prior art systems.

Accordingly, it is an object of the invention to provide a memory cartridge unloading system which is capable of generating a great force by use of a lever and also of reducing the size of the whole system.

In order to attain the above object, according to the present invention, there is provided a system for unloading a memory cartridge which comprises: a cartridge engagement member disposed within a main body of an electronic apparatus using a memory cartridge in such a manner that it is movable in the insertion and discharge direction of the memory cartridge; and, a leverage mechanism capable of moving the cartridge engagement member and having a leverage which varies decreasingly according to the movements of the memory cartridge engagement member in the discharge direction thereof.

In general, when a memory cartridge, which is inserted into a connector provided in the electronic apparatus, is pulled out of the connector, a great force (for example, 2 kg) is required to firstly pull it out about 3 mm and after then it can be taken out with a relatively small force. The present invention is based on this fact. That is, according to the invention, when unloading the memory cartridge, at first a leverage mechanism having a large leverage is used to pull out a memory cartridge by a given amount by means of the cartridge engagement member and, thereafter, a leverage mechanism having a small leverage is used to move the memory cartridge to a great extent.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENTS

Detailed description will hereunder be given of the preferred embodiments of a system for unloading a memory cartridge according to the present invention with reference to the accompanying drawings.

Figure 2:
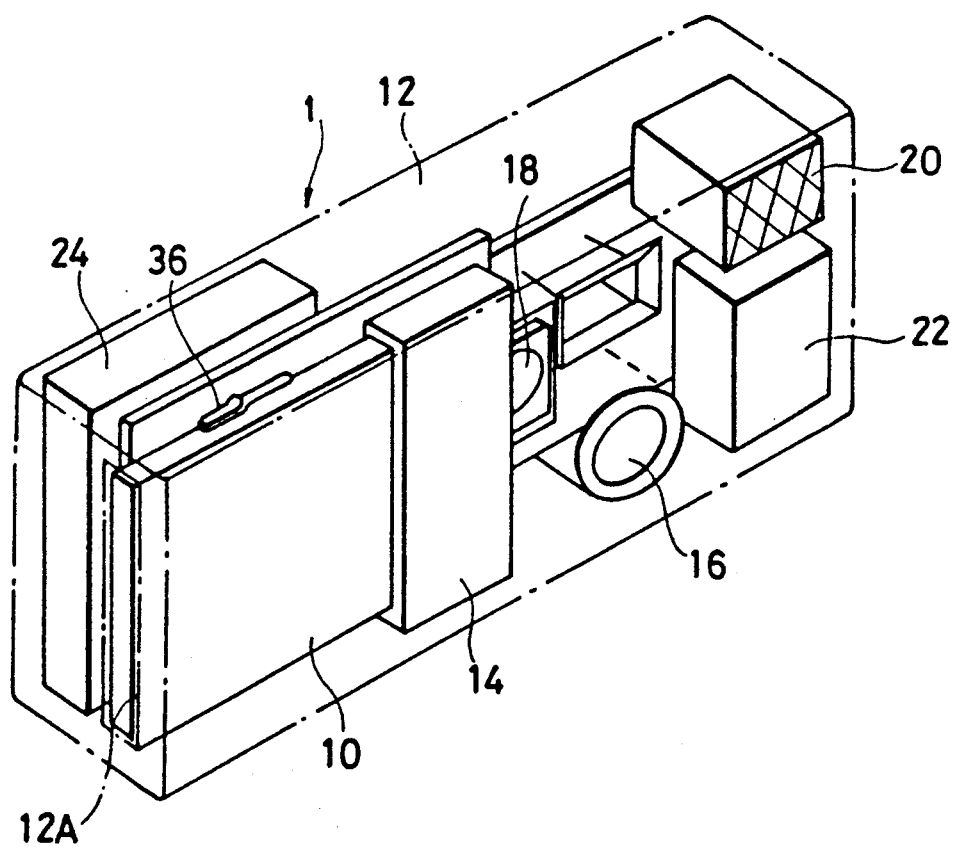
FIG. 2 is a schematic view of an electronic still camera to which the memory cartridge unloading system shown in FIG. 1 is applied.

Referring now to FIG. 2, there is shown a perspective view of the interiors of an electronic still camera to which a memory cartridge unloading system is applied.

In general, an electronic still camera employs a solid state image pickup element and, as a recording medium, a magnetic disc, and thus is capable of picking up the still image of an object electronically and of recording the still image of the object into a magnetic disc which is rotating. And, the reproduction of the image is performed by use of a television system, a printer or the like which is provided separately from the electronic still camera. In such electronic still camera, use of a memory cartridge instead of the magnetic disc can eliminate the need for a mechanism part including a mechanism for rotating the magnetic disc, a mechanism for moving a magnetic head which is used to record into or reproduce from the magnetic disc, and other mechanisms, whereby the camera can be reduced in both size and weight. By the way, the currently available memory cartridge has a storage capacity which is capable of recording up to 6 or 7 images. However, by means of integration of a memory circuit, improvement of a process circuit and the like, it is possible to realize a memory cartridge having a much larger storage capacity which is capable of recording the same number of images with the storage number (50 images) of the currently used magnetic disc.

Now, the memory cartridge includes a large number of SRAMs on a base plate thereof and stores a battery for backing up, and the memory cartridge is formed in a card-like shape. Also, on the insertion side of the memory cartridge, there are arranged a great number of terminals which are in turn connected with the SRAMs and the like.

Figure 7:
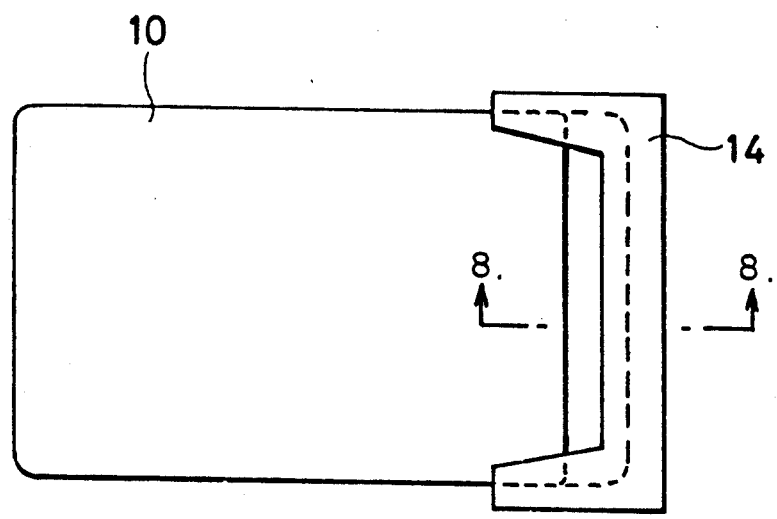
FIG. 7 is a plan view of the memory cartridge and its associated connector; and, FIG. 8 is a section view taken along the line 8—8 in FIG. 7.
Figure 8:
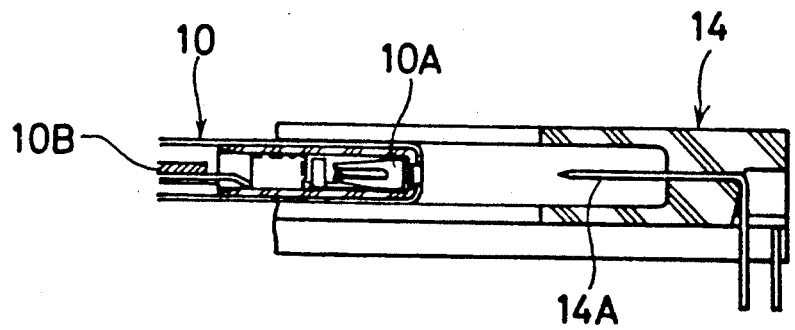

Now, in FIG. 7, there is shown a plan view of the memory cartridge and its associated connector, illustrating a state just prior to insertion of the memory cartridge into the connector and, in FIG. 8, there is shown a section view taken along the line 8—8 in FIG. 7. That is, in the connector 14, there are provided pins 14A which are used to connect circuits in the memory cartridge 10 with circuits in the main body of the electronic apparatus 1 such as a camera. On the other hand, in the memory cartridge 10, there are provided sockets (terminals) 10A which are used to hold the pins 14A therein with elasticity and thus can be connected with the pins 14A electrically. In particular, in the memory cartridge 10, there are arranged 20 to 60 pcs. of such sockets 10A. Because the respective sockets 10A hold the pins therein with elasticity, a great resistance force is produced when the memory cartridge 10 is inserted into or taken out of the connector 14. Here, reference character 10B designates a base plate on which there are mounted circuits such as SRAMs, Programmable Read Only Memories (PROMs) and the like.

Referring back again to FIG. 2, the memory cartridge 10 is inserted into a camera main body 12 from an insertion opening 12A formed in the side portion of the camera main body 12 and is then fitted into the connector 14 disposed in the camera main body 12. Then, the rear end face of the memory cartridge 10 is substantially level with the side surface of the camera, thereby eliminating the possibility that the rear end face may get in the way when gripping the camera. Here, numeral 16 designates a taking lens, 18 a Change Coupled Device (CCD) sensor, 20 a strobe, 22 a battery box, and 24 a power supply circuit, respectively.

Figure 1:
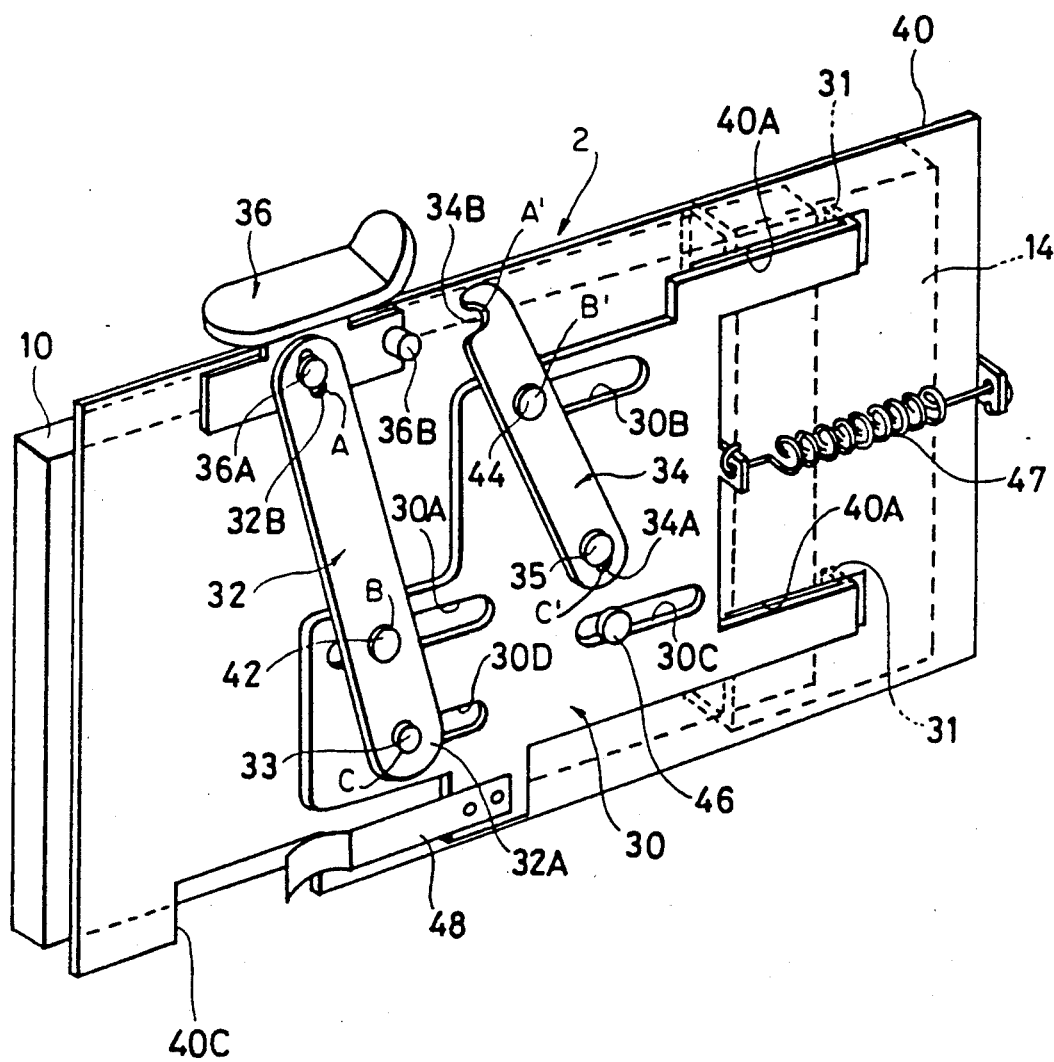
FIG. 1 is a perspective view of an embodiment of a memory cartridge unloading system according to the invention.

Now, in FIG. 1, there is shown a perspective view of an embodiment of a system or device 2 for unloading the memory cartridge to be stored within the camera shown in FIG. 2. The memory cartridge unloading system is mainly composed of a cartridge engagement member (a slide plate) 30, a first lever 32, a second lever 34, and an eject lever knob 36.

The slide plate 30 is formed with three elongated bores 30A, 30B, 30C which are engageable with three pins 42, 44, 46 fixed to a frame 40 on the side of the camera, respectively, whereby the slide plate 30 can be slidably guided in the direction of insertion and discharge of the memory cartridge. Here, the pins 42 and 44 also serve as the first and second fulcrums of rotation B and B' of the first and second levers 32 and 34, respectively.

Also, in the slide plate 30, there are provided two, hookedly folded engagement portions 31, 31 which are projected into the connector 14 through guide grooves 40A, 40A in the frame 40 and a guide grooves (not shown) in the connector 14, respectively. And, the engagement portions 31, 31 are arranged so as to be able to butt against and engage with the memory cartridge 10 at the two ends positions of the front surface of the memory cartridge 10 to be inserted into the connector 14, where no terminals of sockets are arranged.

Further, in the slide plate 30, there are arranged a coil spring 47 and a plate spring 48. The coil spring 47 is used to return the slide plate 30 to its initial position. Also, the plate spring 48 is used to prevent the memory cartridge 10 from slipping off out of place. In particular, when the slide plate 30 is moved in the discharge direction of the memory cartridge, the plate spring 48 projects out from a window portion 40C in the frame 40 to hold down the memory cartridge.

The first lever 32 is arranged in the frame 40 such that it can be freely rotated by the above-mentioned pin 42 and, in one end portion 32A of the first lever 32 which serves as a point of action C thereof, there is planted a pin 33 which is engageable with an elongated bore 30D formed in the slide plate 30. Similarly, the second lever 34 is slidably mounted in the frame 40 by the pin 44 and one end portion 34A thereof, which serves as a point of action C' thereof, in engagement with the slide plate 30 through a pin 35.

Also, the eject lever knob 36 is mounted on the upper surface of the camera main body 12 in such a manner that it can be slid freely in the same direction with the cartridge insertion/discharge direction (FIG. 1). In the lower end portion of the eject lever knob 36, there are provided a pin 36A which is engageable with the other end portion 32B of the first lever 32 serving as a point of force A thereof, and a pin 36B which, only in a predetermined range of movements of the eject lever knob 36, is engageable with the other end portion 34B of the second lever 34 serving as a point of force A' thereof.

As can be understood from FIG. 1 as well, the first lever 32 has a first large leverage (that is, a rate of increase of force due to use of a lever, or a coefficient of increase of movements), while the second lever 34 has a second small leverage. For example, the leverage of the first lever 32 is 4, while the leverage of the second lever 34 is ¼. Therefore, if the first lever 32 is rotated by use of the eject lever knob 36, then a great force (that is, a force 4 times the operation force of the eject lever knob) can be applied to the slide plate 30 and, if the second lever 34 is rotated similarly, then the slide plate 30 can be moved to a great extent (that is, 4 times the amount of movement of the eject lever knob).

Next, description will be given below in detail of the operation of the memory cartridge unloading system constructed in the above-mentioned manner with reference to FIGS. 3(A) to (C).

Figure 3A:
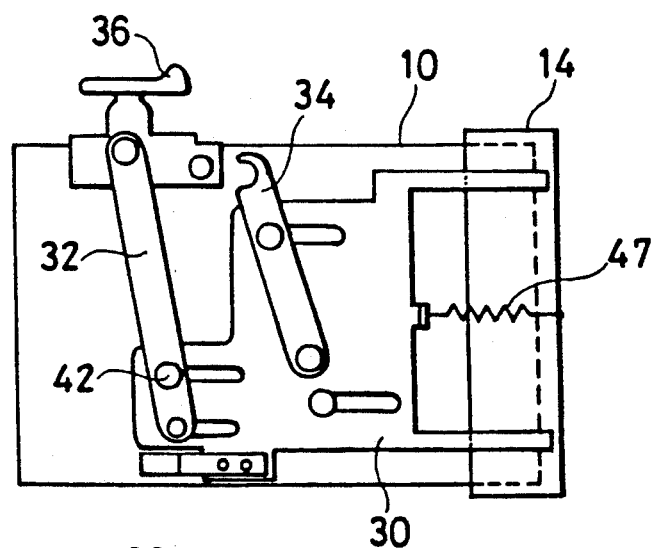
FIGS. 3(A) to (C) are respectively plan views of the above-mentioned memory cartridge unloading system, which are used to explain the operation of the memory cartridge unloading mechanism.

In FIG. 3(A), there is illustrated a state in which the memory cartridge 10 is being inserted in the connector 14. In this state, the slide plate 30 has been returned to its initial position by the coil spring, with the result that the first lever 32, second lever 34 and eject lever knob 36 are situated in their predetermined positions of rotation or sliding, respectively.

Figure 3B:
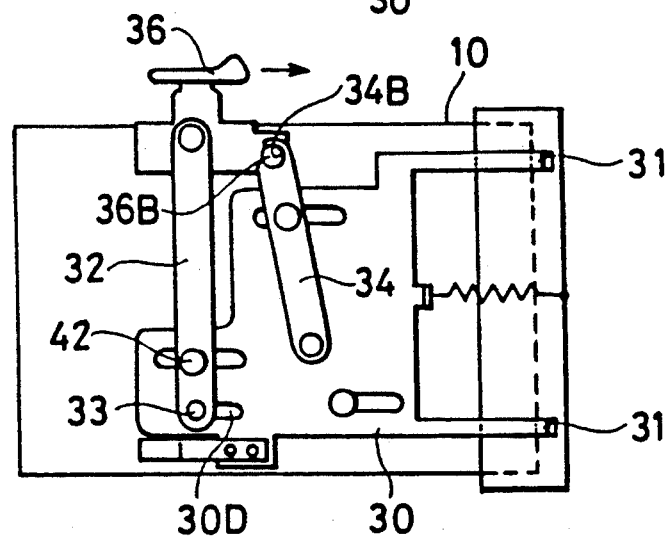
Figure 3C:
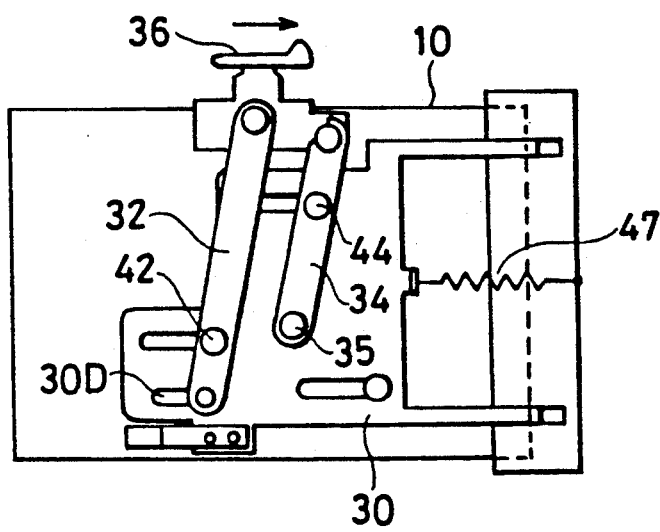

In order to take out or unload the memory cartridge 10 from the above-mentioned state, the eject lever knob 36 may be slid right in FIG. 3. Now, in FIG. 3(B), there is shown a state in which the eject lever knob 36 is slid a given amount from the position shown in FIG. 3(A) and, as a result of this, the pin 36B of the eject lever knob 36 is abutted against the other end portion 34 of the second lever 34 serving as the point of force thereof.

Due to the movement of the eject lever knob 36 during the above operation, the first lever 32 is rotated about the pin 42 and thus the pin 33 planted on the portion of the first lever 32 serving as the point of action C thereof is brought into engagement with the left end portion of the elongated bore 30D in the slide plate 30 to thereby cause the slide plate 30 to slide. Here, because of the large leverage of the first lever 32, a great force is applied to the memory cartridge 10 by means of the engagement portions 31, 31 of the slide plate 30. Therefore, the memory cartridge 10, which is being inserted in the connector 14, can be pulled out from the connector 14 with ease.

Here, when unloading the memory cartridge 10 inserted in the connector 14 therefrom, at first the greatest force is necessary to pull it out by 2 to 3 mm. For this reason, it is preferred that the amount of movement of the slide plate 30 to be moved by the amount of movement of the above-mentioned eject lever knob 36 may be set so as to coincide with the amount of movement that requires the greatest force.

Successively, if the eject lever knob 36 is further slid from the position shown in FIG. 3(B), then the first and second levers are rotated together about the pins 42, 44, respectively, but, because the amount of movement of the point of action (pin 35) of the second lever 34 is greater, the slide plate 30 is moved with the rotation of the second lever 34. During this, due to the presence of the elongated bore 30D, the slide plate 30 is prevented from interfering with the pin 33 of the first lever 32.

By means of the above-mentioned movement of the eject lever knob 36, the memory cartridge 10 is pulled out from the connector 14 and is projected out greatly from the insertion opening 12A of the camera main body 12. Therefore, after then, by gripping and pulling out the rear end portion of the memory cartridge 10 projected out greatly from the insertion opening 12A, the memory cartridge 10 can be taken out easily. If the application of the force to the eject lever knob 36 is stopped, then the slide plate 30 is moved right due to the force of the spring 47, with the result that the slide plate 30 returns to the position shown in FIG. 3A, thereby making it possible to insert the memory cartridge 10. When inserting, the memory cartridge 10 can be mounted with ease because a sufficient mounting force can be obtained by pushing the end portion of the memory cartridge 10 with fingers.

Figure 4:
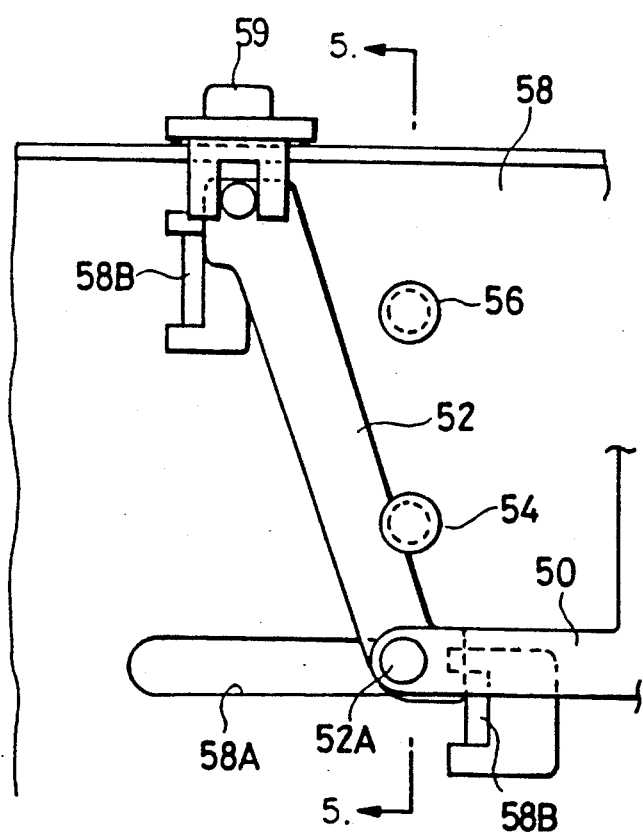
FIG. 4 is a plan view of another embodiment of a memory cartridge unloading system according to the invention.
Figure 5:
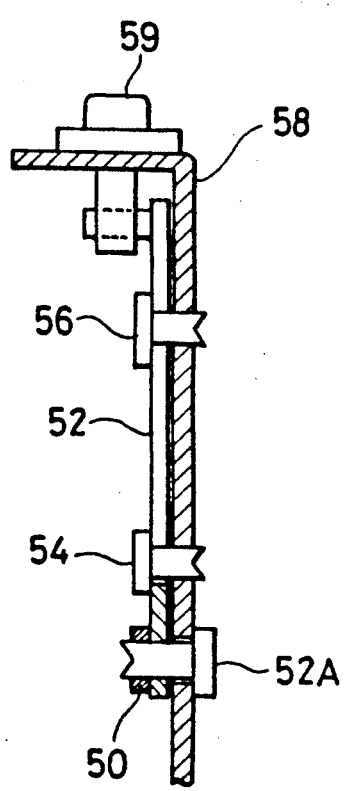
FIG. 5 is a section view taken along the line 5—5 in FIG. 4.

Referring now to FIG. 4, there is shown a front view of another embodiment of a memory cartridge unloading system in accordance with the present invention, and in FIG. 5, there is shown a section view taken along the line 5—5 in FIG. 4.

The memory cartridge unloading system in this embodiment is arranged so as to perform the same function with the before-mentioned embodiment by use of a single lever, while the before-mentioned embodiment uses 2 levers. That is, this embodiment is mainly composed of a slide plate 50, a lever 52, a first fulcrum 54, a second fulcrum 56 and an eject lever knob 59.

The slide plate 50, as in the slide plate 30 provided in the unloading system shown in FIG. 1, is arranged so as to be movable in the cartridge insertion/discharge direction and also includes engagement portions (not shown) which are engageable with the memory cartridge.

The lever 52 is provided in one end portion thereof with a pin 52A which is used to guide the lever 52 to an elongated bore 58A formed in a frame 58, and it also includes the other end portion with which the eject lever knob 59 is in engagement and which serves as a point of force of the lever 52. To the lever 52 is connected the slide plate 50 through the pin 52A. Also, reference characters 58B, 58B respectively designate cut-raised projections formed in the frame 58, which serve as the stoppers for the lever 52.

The first and second fulcrums 54 and 56 are respectively planted on the frame 58 and serve as the fulcrums of rotation of the lever 52 when the lever 52 is rotated, respectively.

Next, description will be given below of the operation of the memory cartridge unloading mechanism constructed in the above-mentioned manner.

At first, if the eject lever knob 59 is moved right in FIG. 4, then the lever 52 is rotated with the first fulcrum as the fulcrum thereof to thereby pull out the memory cartridge through the slide plate 50. In this operation, since the leverage of the lever 52 is great, a great force is given to the slide plate 50, so that the memory cartridge can be pulled out from the connector with ease.

After the lever 52 is abutted against the first and second fulcrums 54 and 56, if the eject lever knob 59 is further moved right in FIG. 4, then the lever 52 is rotated with the second fulcrum 56 as the fulcrum thereof. This reduces the leverage of the lever 52, so that the amount of movement of the point of action (pin 52A) of the lever 52 can be increased.

As described above, according to this embodiment, since the number of levers used can be decreased to one, it is possible to reduce the costs and weight of the unloading system when compared with the unloading system shown in FIG. 1.

Figure 6:
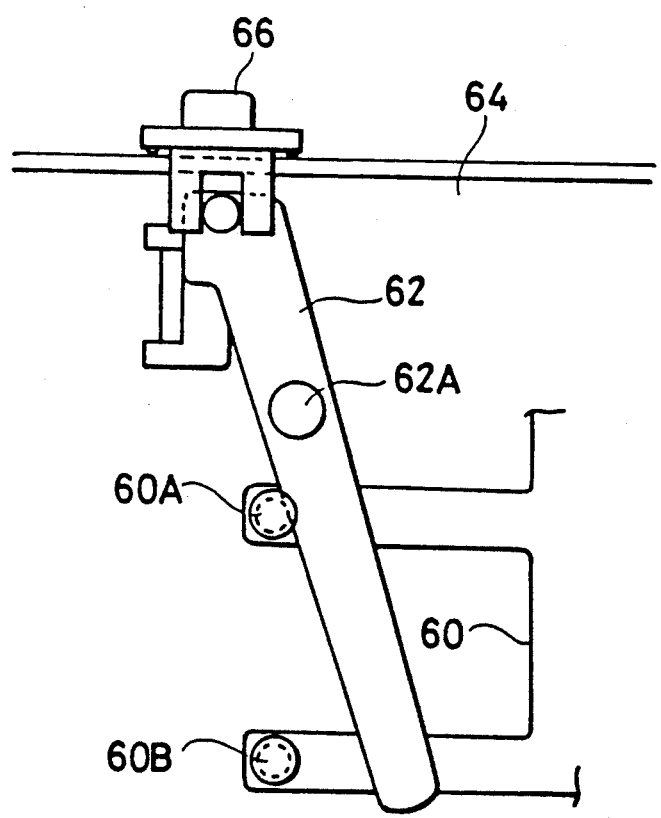
FIG. 6 is a plan view of still another embodiment of a memory cartridge unloading system according to the invention.

Referring now to FIG. 6, there is shown a front view of still another embodiment of a memory cartridge unloading system according to the present invention. In this embodiment, the leverage can be altered by changing the position of a point of action with respect to a slide plate, while in the embodiment shown in FIG. 4 leverage can be changed by providing two lever fulcrums.

In other words, a lever 62 is arranged in a frame 64 rotatably by means of a fulcrum 62A, and in a slide plate 60 there are planted two pins 60A and 60B which serve as first and second lever engagement portions, respectively, and which are respectively engageable with the lever 62. Therefore, if an eject lever knob 66 is moved right in FIG. 6 to thereby rotate the lever 62, then the lever 62 at first applies a great force to the slide plate 60 through the pin 60A and thereafter moves the slide plate 60 greatly by means of the pin 60B.

In the present embodiment, the eject lever knob 66 is adapted such that it can be moved manually, but, however, the knob may be arranged so as to be moved electrically.

As has been described heretofore, according to the memory cartridge unloading system of the present invention, by means of a relatively small amount of movements of the eject member, the great force necessary to pull out the memory cartridge from the connector can be generated and also the memory cartridge can be pulled out sufficiently, whereby the size of the present unloading system can be reduced.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An apparatus in combination with a memory cartridge and having a main body defining therein a path of travel of said memory cartridge in at least an insertion direction and a discharge direction, said apparatus further including a device for unloading said memory cartridge, said device for unloading said memory cartridge comprising:

a cartridge engagement member arranged within said main body of the apparatus and operative to move in said insertion direction and said discharge direction of said memory cartridge, said cartridge engagement member including an engagement portion operative to engage said memory cartridge at least when said cartridge engagement member is moved in said cartridge discharge direction;

a single lever including one end portion serving as a point of action thereof operative to engage with said cartridge engagement member and an other end portion serving as a point of force thereof on which a force is applied;

a first fulcrum disposed at a position where a first leverage is obtained, and serving as a fulcrum of rotation of said single lever while said single lever is present within a range of rotation where said memory cartridge is initially pulled out; and a second fulcrum disposed at a position wherein a second, smaller leverage than said first leverage is obtained, and serving as a fulcrum of rotation of said single lever when said single lever is further rotated beyond said range of rotation.

2. An apparatus in combination with a memory cartridge and having a main body defining therein a path of travel of said memory cartridge in at least an insertion direction and a discharge direction, said apparatus further including a device for unloading said memory cartridge, said device for unloading said memory cartridge comprising:

a cartridge engagement member arranged within said main body of the apparatus and operative to move in said insertion direction and said discharge direction of said memory cartridge, said cartridge engagement member including a memory cartridge engagement portion operative to engage said memory cartridge at least when said cartridge engagement member is moved in said cartridge discharge direction;

a single lever arranged rotatably within said apparatus main body by means of a fulcrum; and first and second lever engagement portions respectively provided in said cartridge engagement member and operative to engage with said single lever, wherein said first lever engagement portion is disposed at a position where a first leverage is obtained and is operative to engage with said cartridge engagement member while said single lever is present within a range of rotation where said memory cartridge is initially pulled out, and said second lever engagement portion is disposed at a position where a second, smaller leverage than said first leverage is obtained and is operative to engage with said cartridge engagement member when said single lever is further rotated beyond said range of rotation.

3. An apparatus in combination with a memory cartridge and having a main body defining therein a path of travel of said memory cartridge in at least an insertion direction and a discharge direction, said apparatus further including a device for unloading said memory cartridge, said device for unloading said memory cartridge comprising:

a cartridge engagement member arranged within said main body and operative to move in said insertion direction and said discharge direction of said memory cartridge, said engagement member including an engagement portion operative to engage said memory cartridge at least when said cartridge engagement member is moved in said cartridge discharge direction; and a leverage mechanism operative to move said cartridge engagement member and to decreasingly change a leverage thereof according to the movements of the cartridge engagement member in said discharge direction.

* * * * *